(12) United States Patent
Coolbaugh et al.

(10) Patent No.: US 6,878,983 B2
(45) Date of Patent: Apr. 12, 2005

(54) HIGH PERFORMANCE VARACTOR DIODES

(75) Inventors: Douglas D. Coolbaugh, Essex Junction, VT (US); Stephen S. Furkay, South Burlington, VT (US); Mohamed Youssef Hammad, Youngtown, AZ (US); Jeffrey B. Johnson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/728,140

(22) Filed: Dec. 4, 2003

(65) Prior Publication Data

US 2004/0082124 A1 Apr. 29, 2004

Related U.S. Application Data

(62) Division of application No. 10/064,754, filed on Aug. 14, 2002, now Pat. No. 6,803,269.

(51) Int. Cl.$^7$ .......................... H01L 27/108; H01L 21/20
(52) U.S. Cl. ........................ 257/312; 257/595; 257/596; 257/598; 438/379
(58) Field of Search ................................ 257/312, 595, 257/596, 598; 438/379, 224, 231

(56) References Cited

U.S. PATENT DOCUMENTS

| | | | |
|---|---|---|---|
| 3,396,317 A | 8/1968 | Vendelin | 317/234 |
| 3,634,738 A | 1/1972 | Leith et al. | 317/234 |
| 3,636,420 A | 1/1972 | Vendelin | 317/234 |
| 3,638,300 A | 2/1972 | Foxhall et al. | 29/589 |
| 3,706,128 A | 12/1972 | Heer | 29/578 |
| 3,860,945 A | 1/1975 | Dawson | 357/14 |
| 4,226,648 A | 10/1980 | Goodwin et al. | 148/175 |
| 4,373,166 A | 2/1983 | Bergeron et al. | 357/15 |
| 4,827,319 A | 5/1989 | Pavlidis et al. | 357/14 |
| 6,653,716 B1 * | 11/2003 | Vashchenko et al. | 257/596 |

OTHER PUBLICATIONS

Archambaul et al., Patent No. EP0231700A, Issued Dec. 19, 1986, France Kannam et al., "Design Considerations of Hyperabrupt Varactor Diodes", IEEE Transactions on Electron Devices, vol. 1, No. 2, Feb. 2, 1971.

* cited by examiner

*Primary Examiner*—Hsien-ming Lee
(74) *Attorney, Agent, or Firm*—Anthony J. Canale

(57) ABSTRACT

A varactor diode having a first electrode comprising a well region of a first conductivity type in a substrate, a second electrode comprising a first plurality of diffusion regions of a second conductivity type abutting isolation regions disposed in said well region, and a second plurality of diffusion regions of said first conductivity type extending laterally from portions of said first plurality of diffusion regions not adjacent said isolation regions and having a dopant concentration greater than that of said first plurality of diffusion regions. The varactor has a tunability of at least approximately 3.5 in a range of applied voltage between approximately 0V to 3V, an approximately linear change in capacitive value in a range of applied voltage between approximately 0V to 2V, and a Q of at least approximately 100 at a circuit operating frequency of approximately 2 GHz.

8 Claims, 3 Drawing Sheets

HIGH PERFORMANCE VARACTOR DIODES

This application is a divisional of Ser. No. 10/064,754; filed on Aug. 14, 2002, now U.S. Pat. No. 6,803,269.

BACKGROUND OF THE INVENTION

1. Technical Field

The invention relates generally to varactor diodes, and more particularly to a varactor diode that has enhanced properties for RF CMOS and BiCMOS applications.

2. Background Art

Variable reactors (varactors) are essential for the design of key radio frequency (RF) CMOS and BiCMOS circuits, and are specifically used as tuning elements in voltage controlled oscillators (VCOs), phase shifters, and frequency multipliers. A varactor is a diode having a capacitance that varies as a function of applied voltage. Examples of such diodes include U.S. Pat. No. 3,396,317, "Surface-Oriented High Frequency Diode;" U.S. Pat. No. 3,634,738, "Diode Having a Voltage Variable Capacitance Characteristic and Method of Making Same;" U.S. Pat. No. 3,636,420, "Low-Capacitance Planar Varactor Diode;" and U.S. Pat. No. 3,860,945, "High Frequency Voltage-Variable Capacitor."

In order to enhance the capacitive swing of a varactor it also known to vary the dopant concentration of one or both of the diffused electrodes of the diode such that the diffusion has a retrograde dopant profile (that is, the dopant concentration is higher at the lower portion of the diffusion region than it is in the top). These so-called "hyperabrupt" junctions greatly increase the change in varactor capacitance for a given voltage swing. See U.S. Pat. No. 3,638,300, "Forming Impurity Regions In Semiconductors;" U.S. Pat. No. 3,706,128, "Surface Barrier Diode Having a Hypersensitive N Region Forming a Hypersensitive Voltage Variable Capacitor." U.S. Pat. No. 4,226,648, "Method of Making a Hyperabrupt Varactor Diode Utilizing Molecular Beam Epitaxy;" and U.S. Pat. No. 4,827,319, "Variable Capacity Diode With Hyperabrupt Profile and Plane Structure and the Method of Forming Same."

In general, varactor designs must maximize a number of properties. One is "tunability," which is the ratio between the highest and lowest capacitive values (Cmax/Cmin) over the range of applied voltages for the circuit. Another is "linearity." There are two definitions of 'linearity': 1/sqrt(C) and d(lnC)/dV, where C is the voltage-dependent varactor capacitance. In the first case it is desired that 1/sqrt(C) be a straight line and the second that d(lnC)/dV be a constant, both as V varies. Yet another property is "Q," or quality factor, which a function of the series resistance of the diode and the capacitive value of the varactor at the higher frequency ranges of the circuit. See Kannnam et al, "Design Considerations of Hyperabrupt Varactor Diodes," IEEE Transactions of Electron Devices, Vol. ED-18, No. 2, February 1971 pp. 109–115 for a discussion of the interplay between tunability and Q.

In practice, it has proven to be difficult to simultaneously enhance tunability, linearity, and Q of a varactor when integrated into a CMOS or BiCMOS process. For example, considering the PFET source/drain junction and well as a varactor device, additional n-well implants will decrease the well resistance and increase varactor Q, but will decrease varactor tuning range by making the source/drain p-n junction depletion regions smaller.

Accordingly, a need has developed in the art for a varactor design that optimizes the tradeoffs between all of these properties, particularly when integrated into a process for forming other integrated circuit devices.

SUMMARY OF THE INVENTION

It is thus an object of the present invention to provide a varactor that optimizes the tradeoffs between tunability, Q, and linearity.

It is another object of the invention to provide a varactor that has maximized tunability, Q, and linearity when integrated into a process for forming other integrated circuit devices.

The foregoing and other objects of the invention are realized, in a first aspect, by a varactor diode comprising a well region of a first conductivity type in a substrate; a plurality of isolation regions on upper portions of the well region; a plurality of masking structures having first and second sides formed on the substrate between respective ones of said plurality of isolation regions; a first plurality of diffusion regions of a second conductivity type, at least some of said plurality of diffusion regions abutting respective ones of said plurality of isolation regions; and a second plurality of diffusion regions of said first conductivity type abutting portions of said first plurality of diffusion regions that do not abut respective ones of said plurality of isolation regions, said second plurality of diffusion regions extending below respective sides of respective ones of said plurality of masking structures, wherein respective ones of said second plurality of diffusion regions do not contact one another.

Another aspect of the invention is a varactor diode having a first electrode comprising a well region of a first conductivity type in a substrate, a second electrode comprising a first plurality of diffusion regions of a second conductivity type abutting isolation regions disposed in said well region, and a second plurality of diffusion regions of said first conductivity type extending laterally from portions of said first plurality of diffusion regions not adjacent said isolation regions and having a dopant concentration greater than that of said first plurality of diffusion regions, said varactor having a tunability of at least approximately 3.5 in a range of applied voltage between approximately 0V to 3V, and an approximately linear change in capacitive value in a range of applied voltage between approximately 0V to 2V.

Yet another aspect of the invention is a method of forming a varactor diode in a substrate, comprising forming a well region of a first conductivity type in the substrate; forming a plurality of isolation regions on upper portions of the well region; forming a plurality of masking structures having first and second sides formed on the substrate between respective ones of said plurality of isolation regions; forming a first plurality of diffusion regions of a second conductivity type, at least some of said plurality of diffusion regions abutting respective ones of said plurality of isolation regions; and forming a second plurality of diffusion regions of said first conductivity type abutting portions of said first plurality of diffusion regions that do not abut respective ones of said plurality of isolation regions, said second plurality of diffusion regions extending below respective sides of respective ones of said plurality of masking structures, wherein respective ones of said second plurality of diffusion regions do not contact one another.

A further aspect of the invention is a method of forming an integrated circuit on a semiconductor substrate, comprising forming first and second well regions of a first conductivity type in the substrate; forming a plurality of isolation regions on upper portions of each of said well regions; forming a plurality of conductive structures having first and second sides on each of said well regions, said structures comprising masking structures on said first well regions and gate electrodes on said second well regions; masking said second well regions; forming a first plurality of diffusion regions of a second conductivity type in said first well regions, at least some of said plurality of diffusion regions abutting respective ones of said plurality of isolation regions; and forming a second plurality of diffusion regions of said first conductivity type in said first well regions abutting portions of said first plurality of diffusion regions that do not abut respective ones of said plurality of isolation regions, said second plurality of diffusion regions extending below respective sides of respective ones of said plurality of masking structures, wherein respective ones of said second plurality of diffusion regions do not contact one another.

BRIEF DESCRIPTION OF THE DRAWINGS

The foregoing and other features of the invention will become more apparent upon review of the detailed description of the invention as rendered below. In the description to follow, reference will be made to the several figures of the accompanying Drawing, in which.

DETAILED DESCRIPTION OF THE PREFERRED EMBODIMENTS OF THE INVENTION

Figure 1:
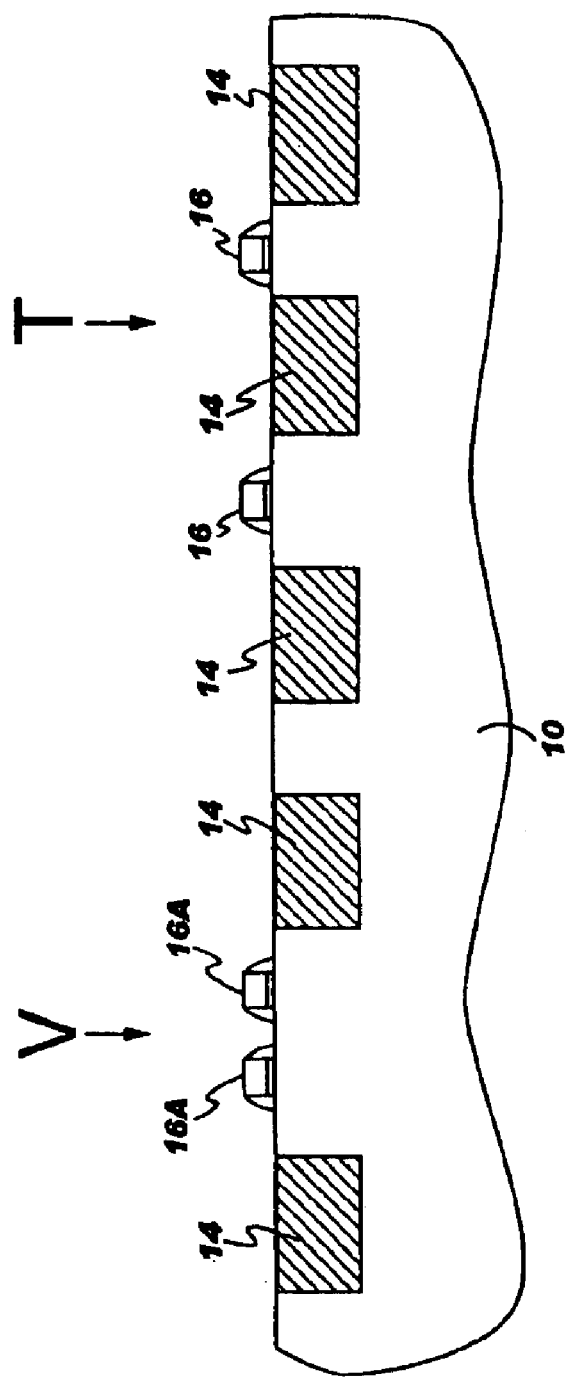
FIG. 1 is a cross-sectional views of a substrate 10 fabricated in accordance with a first embodiment of the present invention.

With reference to FIG. 1, the varactor of the invention V is shown as formed on a semiconductor substrate 10. The substrate is typically made of single-crystal silicon, but it could also be other semiconductor materials such as SiGe and Group III–V semiconductors such as GaAs or InP. While a bulk substrate is shown, the invention could also be practiced on a silicon-on-insulator (SOI) substrate, wherein an upper layer of silicon is separated from the bulk substrate by a buried oxide layer (BOX). Moreover, the upper surface of the substrate could be doped with an atom that increases strain and hence mobility of minority carriers. For a silicon substrate, a Ge implant is used to achieve this result.

The first embodiment of the varactor of the invention will be described with reference to a conventional CMOS process. Note that in FIGS. 1 and 3, the substrate area to the left (V) is the area where the varactor will be formed, and the area to the right (T) is where the transistors will be formed. As such, the processes used to form the varactor will be those used in a CMOS process to form a transistor, with exceptions as noted below. As a practical matter there will be far more transistors formed than varactors; the single varactor and two transistors are shown for ease of illustration. It will also be readily apparent to those of skill in the art that this embodiment of the invention could also be carried out in a BiCMOS process.

In accordance with the first embodiment of the invention shallow trench isolation regions 14 are formed in the substrate, using a conventional process of aniotropically etching trenches in the substrate through a mask using conventional reactive ion etching (RIE) techniques, then filling the trenches with isolation and removing portions of the isolation outside the trenches utilizing chemical-mechanical polishing (CMP) techniques. Depending on the composition of the substrate 10, instead of filling the trenches completely with isolation such as silicon oxide, an alternative is to partially fill the trenches with oxide and then complete the fill with undoped polysilicon (this modulates the stress put on the substrate by the isolation regions). An isolation trench completely filled with silicon oxide is shown for ease of illustration.

Then, as shown in FIG. 1, at the same time the gate electrodes 16 of the FETs in are formed in region T, mask structures 16A are formed in region V. As such, the mask structures 16A have the same general construction as the gate electrodes 16 of the FETs. As shown in magnified form in FIG. 2, the mask structures 16A have a lower dielectric layer 18 of silicon oxide, silicon nitride, silicon oxynitride, or other suitable material; a conductor 20 such as doped polysilicon, silicide, or other material suitable for a FET gate; and sidewall spacers 22 of silicon oxide, silicon nitride, an organic insulator having a low dielectric constant, or preferably a combination of silicon oxide and silicon nitride. As previously stated, these are the same structures as those of FET gates 16, and are formed using conventional processes. As previously stated, this embodiment of the invention is optimized for integration into a BICMOS or CMOS process; if this integration is not desired, mask structures 16 could be a single block of material such as silicon oxide or silicon nitride that is suitably patterned by etching through a photoresist.

Figure 2:
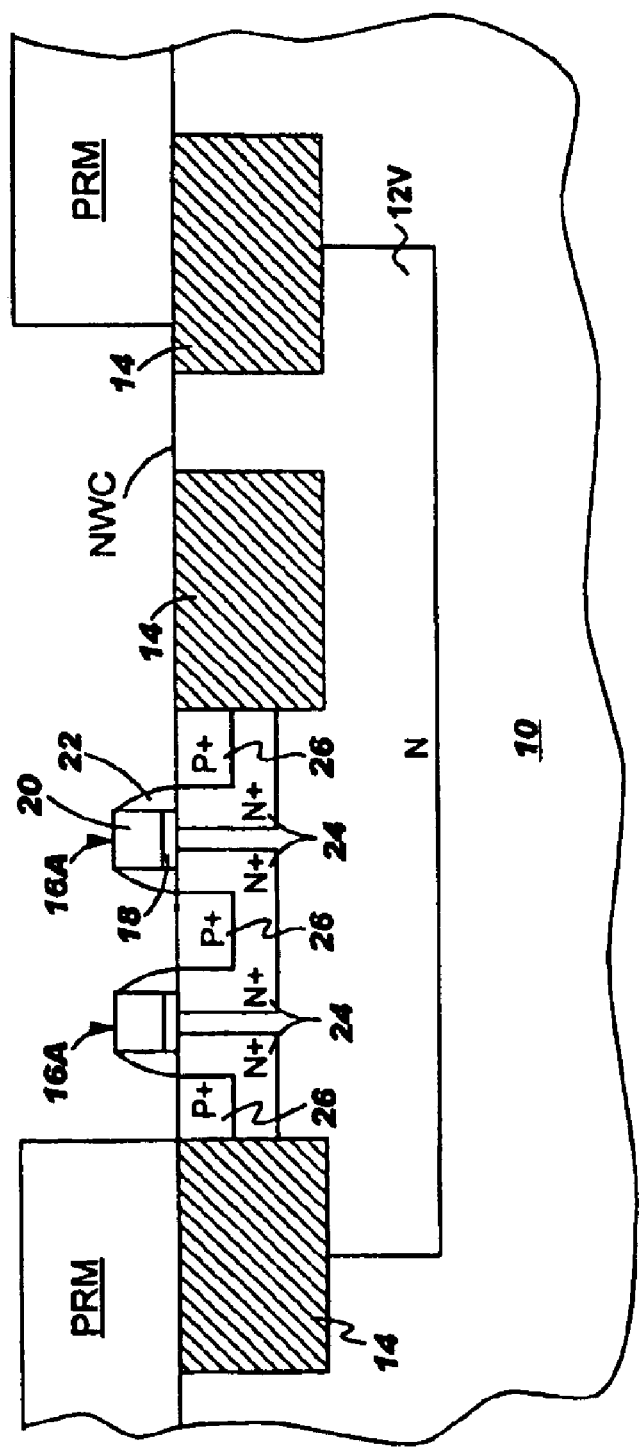
FIG. 2 is a magnified cross sectional view of the vacator portion of the substrate shown in FIG. 1, illustrating additional process steps in accordance with the first embodiment of the present invention.

At this point in the process, the CMOS transistor formation process is suspended, and process steps are carried out that are unique to the varactors. As shown in FIG. 2, the substrate surface is covered by a layer of photoresist, and the photoresist is patterned to form a photoresist mask PRM that exposes only those areas of the substrate where the varactors are to be formed.

A first implant is carried out to form an n-implanted well region 12V. One of the advantages of the process of the invention is that by forming the n-well for the varactors separately from the n-well for the transistors, a separate well implant profile can be generated that optimizes the properties of the varactor. Alternatively, the same implant can be used to form varactor well region 12V and transistor well region 12T (see FIG. 3), by use of a separate mask that exposes both regions. The inventors have found that conventional well implant doses and energies provide sufficient series resistance properties to optimize the properties of the varactor diodes.

Then a second implant is carried out to form regions 24. These regions provide the hyperabrupt profile required for high performance varactors. The dopant can be phosphorous, arsenic, or antimony, at a dose of between approximately $1 \times 10^{11}$ to $1 \times 10^{14}$ atoms/cm$^2$ and at an energy between approximately 10–40 Kev, most preferably a concentration of approximately $1 \times 10^{11}$ atoms/cm$^2$ and an energy of 170 Kev for implanted Sb. Note that the resulting diffusion regions extend beneath the mask structures 16A, toward one another but separated by a portion of n-well 12V.

This is important because the region under the gate is usually the lowest doped portion of the well. Because it is low doped, it readily depletes under reverse bias so that the tuning range is increased. However, both sides are depleting (under 16A), and if the depletion regions touch then the capacitance will be pinned (truncating the tuning range). In practice, this profile is preferably achieved by angling the implant to be between approximately 7 and 60 degree with respect to the plane of the substrate. This profile could also be achieved by carrying out a sequence of vertical implants at varying doses and energies, or by combining vertical and angled implants. This implant beneath the mask structures 16A maximizes tunability by maximizing the area of the final implant regions that remain after the counterdoping process, described below, which forms the P+ part of the p-n junction varactor (that is, prior to the implant step described below, regions 24 laterally extend to adjacent side surfaces of the isolation regions 14). At the same time, the lateral nature of this implant minimizes distortion of the desired hyperabrupt doping profile, which maximizes both linearity and Q. Thus, a high Q is achieved using the high-energy implant without sacrificing tunability.

An alternate embodiment of the invention is to carry out the halo implant for the transistors and the implant to form regions 24 in the varactors at the same time and through the same mask.

Then, a third implant is then carried out to form regions 26. The dopant can be boron, at a dose between approximately $1 \times 10^{14}$ and $8 \times 10^{15}$ atoms/cm$^2$ (preferably $2-5 \times 10^{15}$ atoms/cm$^2$) and an energy between 1–15 keV. Preferably, this implant step is carried out by first removing mask PRM shown in FIG. 2 and defining a new mask through which regions 26 are formed in the varactor portion of substrate 10 and are also formed in regions T to provide the source/drain electrodes of the FET (such a mask would leave the substrate contact area unexposed, so that the substrate contact area only receives implants 12A and 24). Alternatively, this step can be a dedicated implant through a dedicated mask, with the source/drain regions being formed through a separate mask. In the varactor region this implant minimizes the total series resistance of the device. Note that as opposed to the previous implant, regions 26 are preferably formed by use of a conventional, directional implant process that counterdopes portions of regions 24 exposed by mask 16A. Note that regions 26 extend from the exposed side of an adjacent isolation region 14 to the applicable side of the mask 16A.

Figure 3:
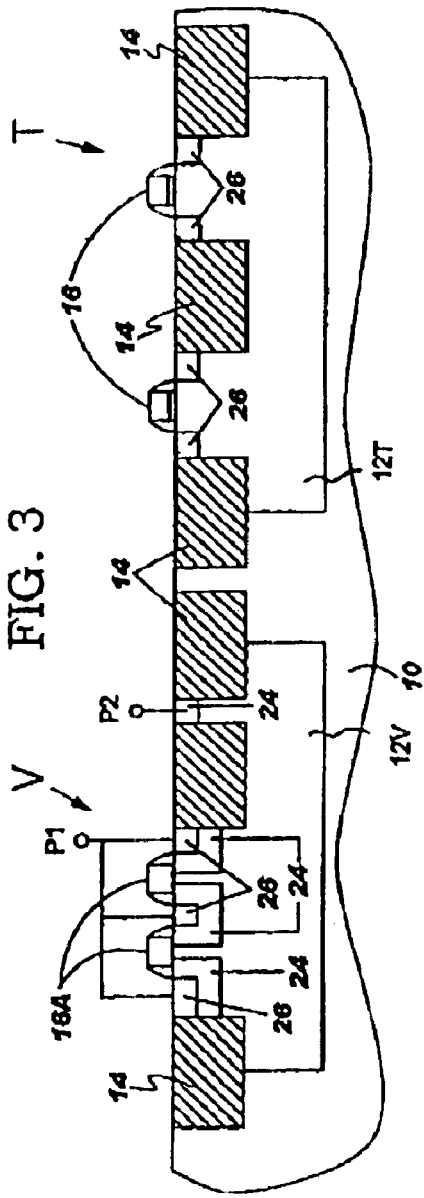
FIG. 3 is a cross sectional view of a portion of the substrate to the same level of magnification as in FIG. 1, illustrating the remaining process steps of the first embodiment of the invention, as well as illustrating a structural embodiment of the invention.

FIG. 3 is a cross sectional view of a portion of the substrate to the same level of magnification as in FIG. 1, illustrating the remaining process steps of the first embodiment of the invention, as well as illustrating a structural embodiment of the invention. Note that if the source/drain regions are formed separately in the transistor regions T from regions 26 in regions V, the source/drain regions can optionally include halo implants and extension implants to minimize short channel effects and junction leakage. Note that for each varactor, the regions 26 are interconnected to form a first plate P1 of the diode, and the n-well contact NWC is coupled to a voltage source to provide a second plate P2 of the electrode. As a practical matter these interconnections are provided by a layer of metal on a passivation material (typically doped glass such as phospho-silicate glass or boro-phospho-silicate glass; can be other materials such as the low dielectric constant materials SiLK available from DuPont and Black Diamond available from Applied Materials) that coats the substrate 10 subsequent to the processing shown in FIG. 4. The applicable portions of substrate 10 are contacted by a metal stud (typically made of tungsten, with barrier materials such as titanium nitride, but can be other metals with other barrier materials) that extends through this passivation and contact the overlying metal (can be copper, aluminum, their alloys, or other metals). These materials are simultaneously deposited and patterned on the V and T portions of substrate 10.

Figure 4:
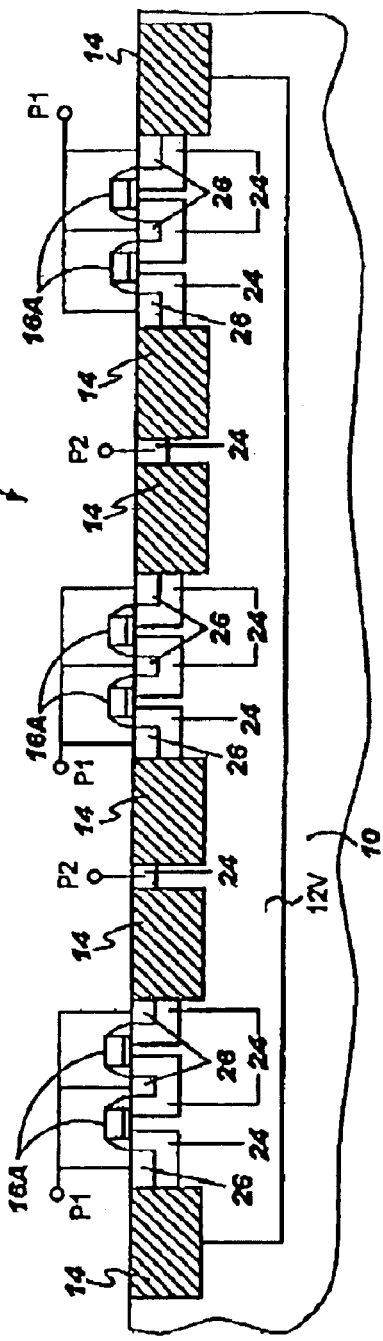
FIG. 4 is a cross sectional view of a portion of the substrate to the same general level of magnification as FIG. 2, illustrating the resulting structure in accordance with a second embodiment of the invention.

FIG. 4 is a cross sectional view of a portion of the substrate to the same general level of magnification as FIG. 2, illustrating the resulting structure in accordance with a second embodiment of the invention. In this embodiment, note that multiple varactors are formed in the same well region 12V. Each varactor shares a well contact P2 with an adjacent varactor. In addition, the varactor is formed in an elongated fashion (i.e., in practice is much longer than it is wide; the width, from one isolation region 14 to the next, is minimized, being on the order of 0.5–2 microns in the varactor area). This combination of features will provide the desired varactor capacitance values while maximizing its energy efficiency Q.

Thus, in the invention an extra lithography mask step introduces two new implants dedicated to minimizing the tradeoffs between tunability, linearity, and Q. Experimental results have confirmed that varactors manufactured in accordance with the embodiment of the invention shown in FIG. 4 possess the following properties in combination:

Excellent tunability (ranging from approximately 2.5 to 3.5 in the 0V to 3V range, respectively) Almost ideal linearity, especially in the 0V to 2V range Reasonable Q (over 50 at 2 GHz)

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto.

What is claimed is:

1. A varactor diode on a semiconductor substrate, comprising:

a well region of a first conductivity type in the substrate;

a plurality of isolation regions on upper portions of the well region;

a plurality of masking structures having first and second sides formed on the substrate between respective ones of said plurality of isolation regions;

a first plurality of diffusion regions of a second conductivity type, at least some of said first plurality of diffusion regions abutting respective ones of said plurality of isolation regions; and a second plurality of diffusion regions of said first conductivity type abutting portions of said first plurality of diffusion regions that do not abut respective ones of said plurality of isolation regions, said second plurality of diffusion regions extending below respective sides of respective ones of said plurality of masking structures, wherein respective ones of said second plurality of diffusion regions do not contact one another.

2. The varactor diode of claim 1, further comprising a first electrical connection that interconnects said first plurality of diffusion regions.

3. The varactor diode claim 2, further comprising a second electrical connection to said well region.

4. The varactor diode of claim 1, wherein said second plurality of diffusion regions have a dopant concentration greater than said first plurality of diffusion regions.

5. The varactor diode of claim 4, wherein said second plurality of diffusion regions have a hyperabrupt doping profile.

6. The varactor diode of claim 4, wherein said second plurality of diffusion regions have a dopant concentration of approximately $1 \times 10^{11}$ atoms/cm$^2$.

7. A varactor diode having a first electrode comprising a well region of a first conductivity type in a substrate, a second electrode comprising a first plurality of diffusion regions of a second conductivity type abutting isolation regions disposed in said well region, and a second plurality of diffusion regions of said first conductivity type extending laterally from portions of said first plurality of diffusion regions not adjacent said isolation regions and having a dopant concentration greater than that of said first plurality of diffusion regions.

8. The varactor diode of claim 7, wherein said varactor has a Q of at least approximately 100 at a circuit operating frequency of approximately 2 GHZ and a tunability of at least approximately 2.5 to 3.5 in a range of applied voltage between approximately 0V to 3V, respectively.

* * * * *